(12) United States Patent
Ibaragi (10) Patent No.: US 7,491,473 B2
(45) Date of Patent: Feb. 17, 2009

(54) PHOTO MASK AND METHOD FOR CONTROLLING THE SAME

(75) Inventor: Toshiaki Ibaragi, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 717 days.

(21) Appl. No.: 10/994,636

(22) Filed: Nov. 23, 2004

(65) Prior Publication Data

US 2005/0233225 A1 Oct. 20, 2005

(30) Foreign Application Priority Data

Apr. 19, 2004 (JP) ............................ 2004-123318

(51) Int. Cl.
*G03F 1/00* (2006.01)
(52) U.S. Cl. ............................................ 430/5; 430/30
(58) Field of Classification Search ................ 430/5, 430/30

See application file for complete search history.

(56) References Cited

U.S. PATENT DOCUMENTS

| | | | | | |
|---|---|---|---|---|---|
| 5,472,811 | A | * | 12/1995 | Vasudev et al. | 430/5 |
| 5,723,236 | A | * | 3/1998 | Inoue et al. | 430/5 |
| 5,798,193 | A | * | 8/1998 | Pierrat et al. | 430/5 |
| 5,866,283 | A | * | 2/1999 | Zandbergen et al. | 430/30 |
| 5,952,133 | A | * | 9/1999 | Nakasuji | 430/22 |
| 6,492,075 | B1 | * | 12/2002 | Templeton et al. | 430/5 |

FOREIGN PATENT DOCUMENTS

| | | |
|---|---|---|
| JP | 11-195585 | 7/1999 |
| JP | 2000-267261 | 9/2000 |

* cited by examiner

*Primary Examiner*—Mark F Huff
*Assistant Examiner*—Stewart A Fraser
(74) *Attorney, Agent, or Firm*—Westerman, Hattori, Daniels & Adrian, LLP.

(57) ABSTRACT

In a photo mask to transfer a mask pattern to a substrate by irradiating ultraviolet rays in a mask-pattern-forming region, an evaluation pattern having depressions in which a growable substance of the same kind as that of a foreign substance growing in the mask-pattern-forming region by ultraviolet rays on at least any one surface out of a mask-pattern-forming surface and the back surface thereof. And, the usage limit of the photo mask is evaluated according to a degree of cloudiness of the respective depressions, for instance, by irradiating the evaluation pattern with a high intensity light source.

19 Claims, 7 Drawing Sheets

(BEFORE MOVEMENT
OF INDEPENDENTLY
MOVABLE BLIND)
※VIEW SEEN FROM
PATTERN SURFACE 8

FIG. 4C (AFTER MOVEMENT
OF INDEPENDENTLY
MOVABLE BLIND)
※VIEW SEEN FROM
PATTERN SURFACE 8

PRIOR ART

PHOTO MASK AND METHOD FOR CONTROLLING THE SAME

CROSS-REFERENCE TO RELATED APPLICATIONS

This application is based upon and claims the benefit of priority from the prior Japanese Patent Application No. 2004-123318, filed on Apr. 19, 2004, the entire contents of which are incorporated herein by reference.

BACKGROUND OF THE INVENTION

1. Field of the Invention

The present invention relates to a photo mask for transferring a mask pattern to a substrate by exposure to ultraviolet rays and a method for controlling the photo mask.

2. Description of the Related Art

Conventionally, even in the case of manufacturing a simple semiconductor device, several times of photolithographic processes have been repeatedly conducted, and when manufacturing a complicated ULSI, sometimes several ten times of photolithographic processes have been repeated. In this photolithographic process, a photo mask on which a predetermined pattern is formed must be prepared for every process.

If a foreign substance is attached to or formed on a photo mask used for the photolithographic process, an erroneous pattern is transferred onto a wafer on which the pattern is to be transferred. In a semiconductor device, this may lead to short-circuiting between circuits or breaks within circuits caused by any foreign substances created on the photo mask. Therefore, the so-called pellicle film is used to protect the photo mask in question to prevent foreign substances from attaching directly to the photo mask. The pellicle film prevents a foreign substance from attaching to a mask pattern formed on the photo mask and allows exposed light to penetrates without attenuation. The pellicle film will be briefly explained below.

Figure 7A:
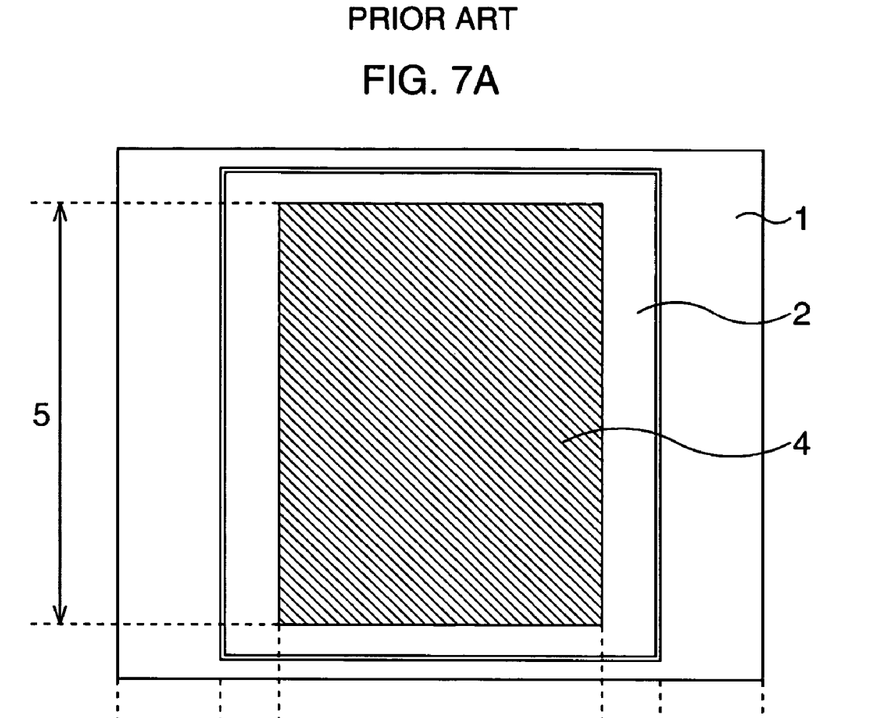
FIGS. 7A and 7B are schematic diagrams showing a conventional photo mask.
Figure 7B:
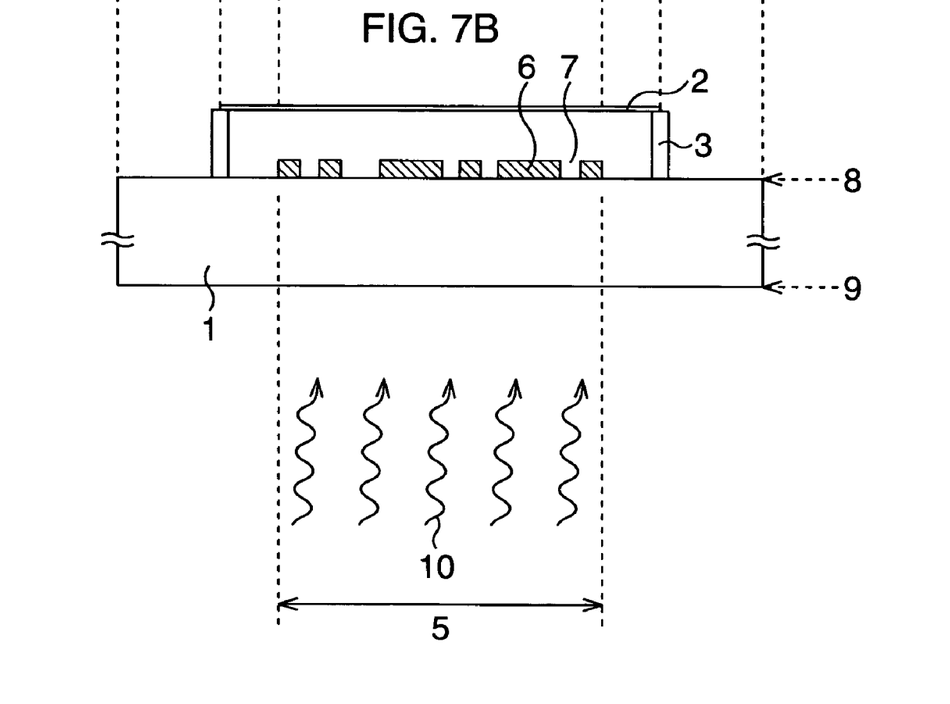

FIGS. 7A and 7B are schematic block diagrams showing a conventional photo mask, FIG. 7A shows its plan view and FIG. 7B shows its sectional view.

In FIGS. 7A and 7B, a pellicle film 2 covering a mask-pattern-forming region 4 on which ultraviolet rays 10 irradiates at exposure is disposed in a photo mask 1. In a case where a foreign substance is attached to the pellicle film 2, since the position of the foreign substance deviates from the pattern imaging surface 8 (hereinafter referred to as a mask-pattern-forming surface) of the photo mask 1 by a height of a pellicle frame 3 made of metal or quartz, an image of the foreign substance is not built up on a wafer onto which the mask pattern is transferred, so that only required patterns 6 and 7 are focused into an image to be transferred. In short, it is made possible to use the photo mask even a foreign substance exists on the pellicle film 2. A photo mask using such a pellicle film is disclosed, for instance, in Patent Document 1.

[Patent Document 1]
Japanese Patent Application Laid-open No. 2000- 267261
[Patent Document 2]
Japanese Patent Application Laid-open No. Hei 11-195585

SUMMARY OF THE INVENTION

An object of the present invention is to provide a photo mask and a method for controlling the photo mask, which make it possible to easily evaluate usage limitation of the photo mask used in the photolithographic process when performing the photolithographic processing by ultraviolet exposure.

A photo mask of the present invention has a mask-pattern-forming region on which a mask pattern is formed on one surface, and is for transferring the mask pattern onto a substrate by ultraviolet exposure. The photo mask is provided with an evaluation section for evaluating usage limitation of the photo mask caused by the ultraviolet exposure on at least either one surface out of the one surface or the back surface of the photo mask.

In another embodiment of the photo mask in the present invention, the evaluation section is provided with a growable substance of the same kind as that of a foreign substance growing by ultraviolet rays in the mask-pattern-forming region.

A method for controlling a photo mask of the present invention is a method for controlling a photo mask which has a mask-pattern-forming region on which a mask pattern is formed on one surface, and is for transferring the mask pattern onto a substrate by ultraviolet exposure. The method includes: providing an evaluation section including a growable substance of the same kind as that of a foreign substance growing in the mask pattern forming region by ultraviolet rays, in an area range of ultraviolet exposure at the time of exposure on at least any one surface out of the one surface and the back surface thereof; and serving the evaluation section for judgment of usage limitation of the photo mask according to a degree of growth of the growable substance.

In another embodiment of the method for controlling the photo mask in the present invention, judgment of the usage limitation is according to a degree of cloudiness in color of the growable substance of the evaluation section.

DETAILED DESCRIPTION OF THE PREFERRED EMBODIMENTS

There are some substances which cannot be prevented from approaching even by the pellicle film 2 which is thought to be extremely effective against attaching of foreign substances to a photo mask. Gases in the atmosphere transfer to and from an interior space closed by the pellicle-le film 2 owing to a pressure adjusting mechanism in the interior space closed by the pellicle film 2 (only one hole is generally provided on a wall of the pellicle frame 3), or a pressure difference between outside and inside the space divided by the pellicle film 2. Besides, gases released from an adhesive or a tackiness agent to stick the pellicle film 2 on the pellicle frame 3, or gas released from the pellicle film 2 itself formed of a thin film made of nitrocellulose, fluoropolymers, or the like are released into the interior space closed by the pellicle film 2. That is, the interior space closed by the pellicle film 2 is considered to be filled more with activated gases such as sulfurous acid gas, ammonia, or the like, compared with atmosphere inside an optical stepper (such as a scanner, a stepper, or the like) or a clean room in which a photolithographic process is performed.

Moreover, in recent years, development in photolithographic processes to shorten the wavelength of a light source for exposure has been advancing due to micronization of semiconductor devices (Patent Document 2). However, when a KrF excimer laser (248 nm), an ArF excimer laser (193 nm), or an $F_2$ (fluorine gas) laser (157 nm) which generates beams shorter in wavelength than conventional g-rays (436 nm) or i-rays (365 nm) and in ultraviolet region is used, the activated gases in the interior space closed by the pellicle film 2 are allowed to react owing to their high light energy to generate foreign substances, so-called haze on the mask pattern 6 and 7.

Furthermore, in a washing process of a photo mask 1, the pellicle film 2 is removed from the photo mask 1, and foreign substances are generated on the mask patterns 6 and 7 depending on such as concentration of residual ions of sulfuric acid or nitric acid used as the washing liquid.

The foreign substances generated on the mask pattern grow or decompose depending on the accumulated amount of irradiated ultraviolet rays at the exposure. Sometimes, some of them show practically no changes. Furthermore, transmittance or reflectances of the foreign substances vary depending on an accumulated amount of irradiated ultraviolet rays. In other words, growable foreign substances growing depending on an accumulated amount of irradiated ultraviolet rays and being main cause of an erroneous pattern on a wafer are considered to be generated by highly energetic ultraviolet rays irradiating to activated gases such as sulfurous acid gas or ammonia in an interior space closed by the pellicle film 2, or to be generated depending on a concentration of residual sulfuric acid ion or nitric acid ion in a washing liquid used in the washing process of the photo mask.

From the same consideration, the above-described foreign substances are formed on a surface 9 (hereinafter, referred to as a glass surface) corresponding to a back face of the mask-pattern-forming surface 8. This is thought to be caused by such a gas as released gas from a vessel called SMIF-POD which has been used in recent years to protect a photo mask or a wafer not to be exposed under the outside atmosphere (inside a clean room), or a released gas from a shipping case itself of the photo mask.

When a foreign substance generated on the photo mask 1 is a growable foreign substance to grow depending on an accumulated amount of irradiated ultraviolet rays, as the more ultraviolet exposure is repeated by a photolithographic process using this photo mask, the greater the growable foreign substance becomes, so that the growable foreign substance is transferred onto a wafer to be transferred as an erroneous pattern. As a result, this brings about short-circuiting between circuits of a semiconductor device or breaks within the circuits.

BASIC GIST OF THE PRESENT INVENTION

In order to solve disadvantages caused by performing ultraviolet exposure of light energy at a shorter wavelength than a conventional wavelength at exposure in a photolithographic process because of a request of further micronization in semiconductor device in recent years, the present inventor has arrived at the basic gist of the present invention shown as below.

A conventional countermeasure against attachment of foreign substances to a photo mask is to provide a pellicle film at a distance from the photo mask by a predetermined height, so that an image of the foreign substance will not build up on a wafer to which a pattern is even when the foreign substance is attached to the pellicle film. However, when exposure using ultraviolet rays is repeatedly performed, a problem due to foreign substances exceeding a range of the countermeasure with the pellicle film arises. The reason for this is that since the ultraviolet rays used for exposure have energy higher than that of a conventional light source, there is a growable foreign substance growing depending on an accumulated amount of irradiated ultraviolet rays among foreign substances generated on the photo mask, and the growable foreign substance grows larger every time the ultraviolet exposure is performed and is transferred to the wafer to which the pattern is transferred as an erroneous pattern. Therefore, in order to achieve high quality with ultraviolet exposure, it becomes necessary to evaluate usage limitation of the photo mask by grasping a degree of the growth of the growable foreign substance generated on the photo mask.

Then, the present inventor considered providing an evaluation section (evaluation pattern) shown below to evaluate the degree of growth of a growable foreign substance generated in a mask-pattern-forming region.

In the present invention, a growable substance of the same kind as that of the growable foreign substance growing by ultraviolet rays in the mask-pattern-forming region is formed on the evaluation pattern. The evaluation pattern is provided in the region of a photo mask served for ultraviolet exposure similarly to the mask pattern. This is to put the growable substance on the evaluation pattern under the same environment as the growable foreign substance generated in the mask-pattern-forming region.

As described above, by forming an evaluation pattern on a photo mask, it becomes possible to easily observe a degree of growth of a growable foreign substance in a mask-pattern-forming region from outside. In other words, the present invention is designed to evaluate a degree of growth of the growable foreign substance in the mask-pattern-forming region using the degree of growth of the growable substance in the evaluation pattern substantially equivalent to the growable foreign substance as an indicator.

When determining the usage limitation of a photo mask, judgment is made by irradiating the evaluation pattern with, for instance, a high intensity light source and visually recognizing a degree of cloudiness in color due to scattered light according to a degree of growth of the growable substance. Therefore, in the present invention, when any possible erroneous pattern on a wafer caused by a growable foreign substance generated in a mask-pattern-forming region can be confirmed by visually recognizing the evaluation pattern from outside, so that control of a photo mask can be easily performed in a short time.

CONCRETE EMBODIMENTS TO WHICH GIST OF PRESENT INVENTION APPLIES

Various embodiments based on the fundamental gist of the present invention will be explained next with reference to the drawings.

First Embodiment

Figure 1A:
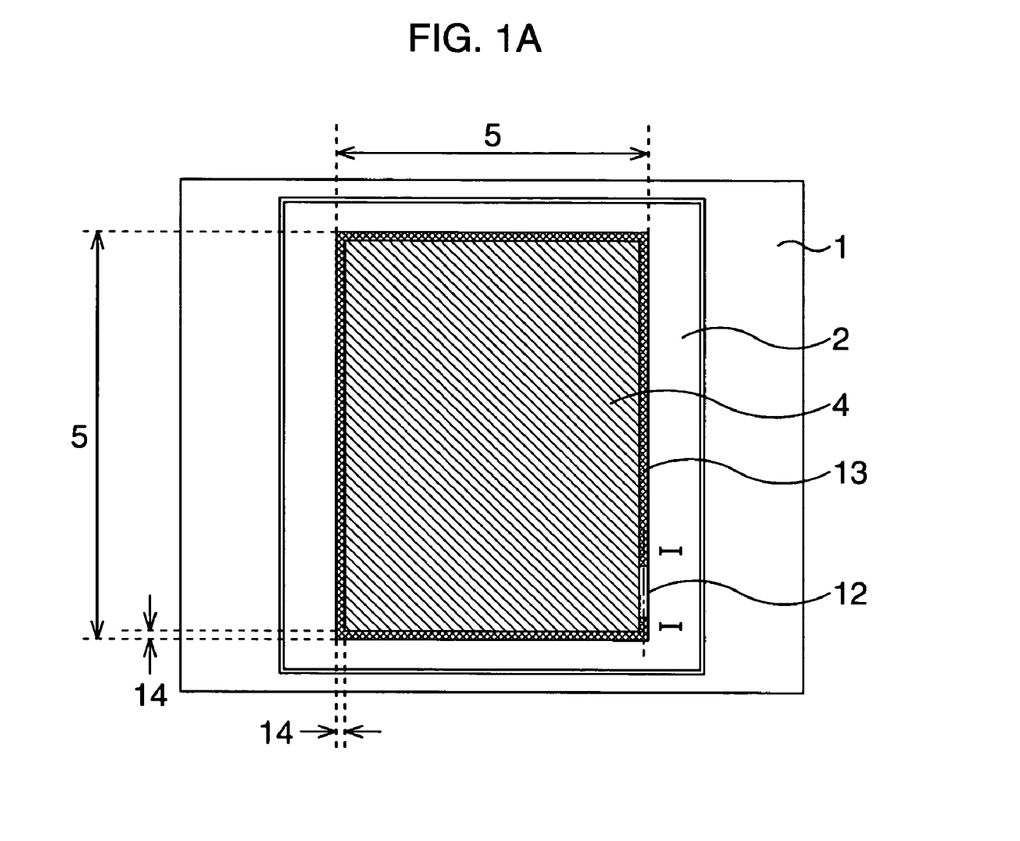
FIGS. 1A and 1B are schematic block diagrams of a photo mask in a first embodiment of the present invention.
Figure 1B:
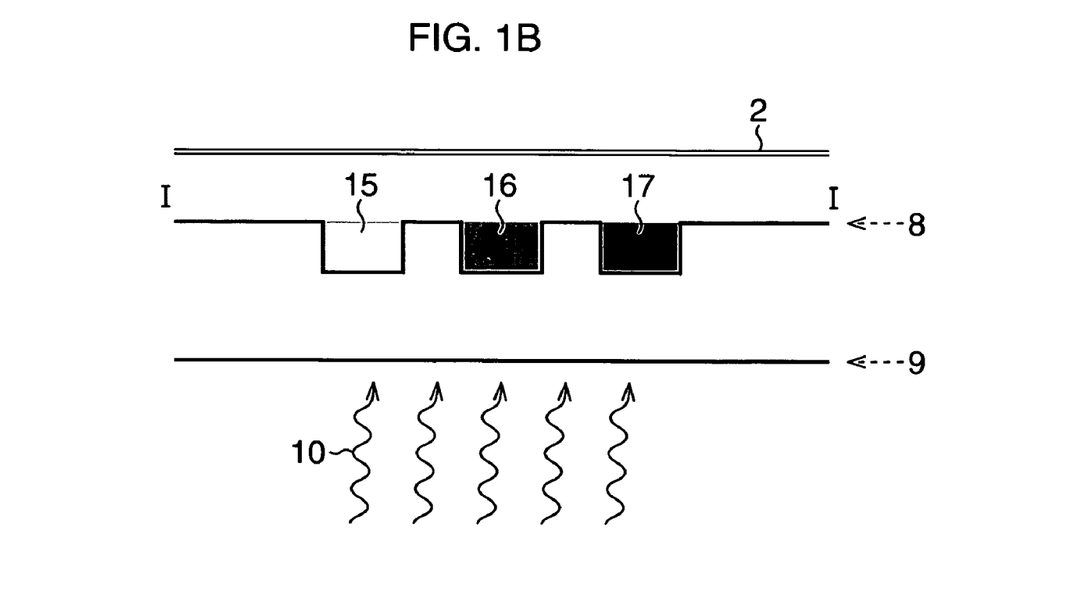

FIG. 1A and FIG. 1B are schematic block diagrams of a photo mask in the first embodiment of the present invention. FIG. 1A shows a plan view of the photo mask, and FIG. 1B shows a sectional view of an evaluation pattern 12 in FIG. 1A taken along the line I-I.

In FIG. 1A, a photo mask 1 includes: a mask-pattern-forming region 4 on which a mask pattern is formed; a scribe-corresponding region 13 positioned around the mask-pattern-forming region 4, and corresponding to a scribed region of a wafer to which the mask pattern is transferred; an evaluation pattern 12 provided on the scribe-corresponding region 13; and a pellicle film 2 covering the photo mask 1 via a pellicle frame (not shown). Further, a light shielding pattern 6 and a light transmitting pattern 7 are formed in the mask-pattern-forming region 4 as shown in FIG. 7B. Ultraviolet rays 10 irradiating at exposure enter from a glass surface 9 side where no mask pattern is formed, enter a mask-pattern-forming surface 8 side and pass through the light transmitting pattern 7 to the pellicle film 2. Here, an effective region to be actually exposed to the wafer is shown by a numeral 5 in FIG. 1A. The width of the scribe-corresponding region 13 is indicated by a numeral 14.

A method for producing a photo mask according to the first embodiment will be explained next.

First, a mask pattern on which the light shielding pattern 6 and the light transmitting pattern 7 are formed as shown in FIG. 7B is formed on one surface of, for instance, a transparent quartz plate which will be the photo mask 1. A forming region on which the mask pattern is formed is the mask-pattern-forming region 4 in FIG. 1A.

Then, the evaluation pattern 12 is formed in the scribe-corresponding region 13 on the side of the mask-pattern-forming surface 8. The evaluation pattern 12 will be explained using FIG. 1B.

As shown in FIG. 1B, the evaluation pattern 12 is formed in the scribe-corresponding region 13 on the side of the mask-pattern-forming surface 8 with plural depressions 15 to 17. The depressions 15 to 17 are formed by a dry etching method, a wet etching method with hydrofluoric acid, or the like. Liquids of a growable substance for evaluation having different residual ion concentrations are dropped into the respective depressions 15 to 17 using a hollow needle of a manipulator, an eye dropper, a glass tube, or the like, and dried. Here, as the liquid of growable substance for evaluation dropped into the respective depressions 15 to 17, a substance containing sulfuric acid ions, nitric acid ions, or ammonium ions which are thought to be the same kind as a foreign substance generated on the photo mask 1 can be cited. FIG. 1B shows a case in which the ion concentration of the growable substance for evaluation in the depression 15 is the lowest and the ion concentration of the growable substance for evaluation in the depression 17 is the highest.

After the liquid of the growable substance for evaluation dropped into the respective depressions 15 to 17 are dried completely, the pellicle film 2 is stuck on the photo mask 1. The sizes of the respective depressions 15 to 17 are suitably formed in a range of about several μm to several hundred μm so as to provide them in the scribe-corresponding region 13. And in the present embodiment, an example of forming the mask pattern and the evaluation pattern 12 separately is shown, but both may be simultaneously formed.

Next, a method for controlling the photo mask in the first embodiment will be explained.

As described above, when a foreign substance generated on the photo mask 1, is a growable foreign substance growing depending on an accumulated amount of the irradiated ultraviolet rays 10, the growable foreign substance grows larger with increased ultraviolet exposure according to the repeated performance of a photolithographic process using the photo mask. When observing the growable foreign substance visually or through a microscope, it is perceived as cloudiness since incident light is scattered according to the degree of growth. For instance, when a dark-field microscope is used, the degree of generating a foreign substance observed as cloudiness (the degree of cloudiness) is clearly recognized. When the size of a foreign substance becomes as large as about 1 μm or so, it can be recognized as cloudiness under reflected or transmitted light even with the naked eye.

As a concrete method for controlling a photo mask using this evaluation pattern 12, for instance, a high-intensity light source irradiates to the evaluation pattern 12 to visually recognize appearances of the respective depressions 15 to 17, and whether cloudiness is observed or not is judged. As an example of the method for controlling a photo mask in an actual production process, it is possible to execute judgment in a manner that when cloudiness begins to be observed in the depression 17 having the highest ion concentration of a growable substance for evaluation (when generation of a growable substance for evaluation is recognized) it is judged that maintenance of the photo mask 1 is required, when cloudiness of the depression 16 begins to be observed, it is judged that rewashing with replacement of the pellicle film 2 on the photo mask 1 is required, and when cloudiness begins to be observed in the depression 15 having the lowest ion concentration of a growable substance for evaluation it is judged that a substance generated in the mask-pattern-forming region 4 might give a huge influence upon a mask pattern to be transferred onto a wafer.

Second Embodiment

Figure 2A:
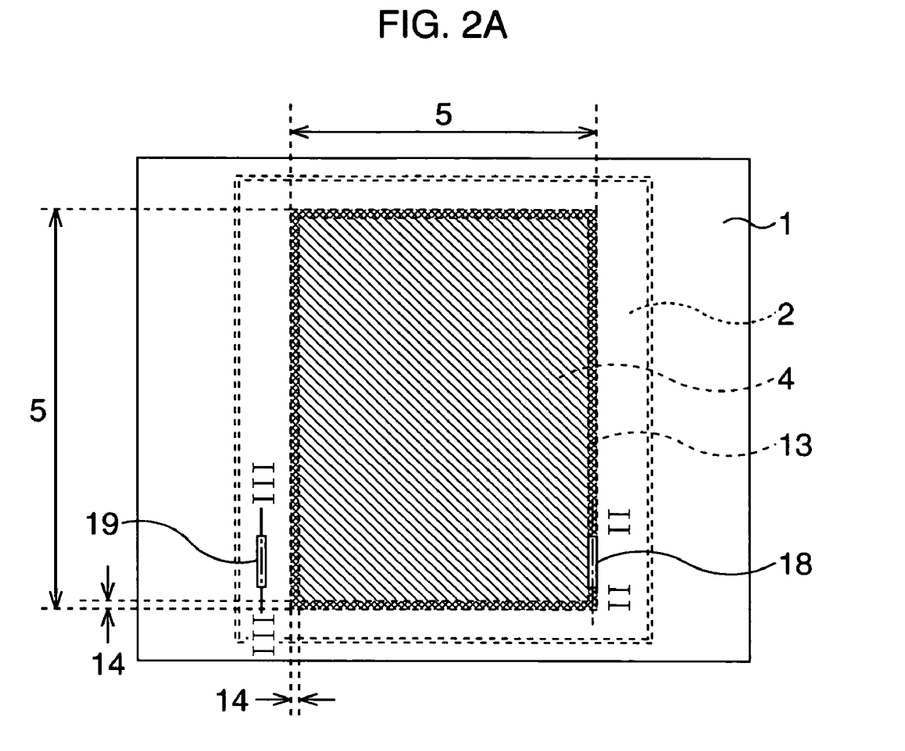
FIGS. 2A and 2B are schematic block diagrams of a photo mask in a second embodiment of the present invention.
Figure 2B:
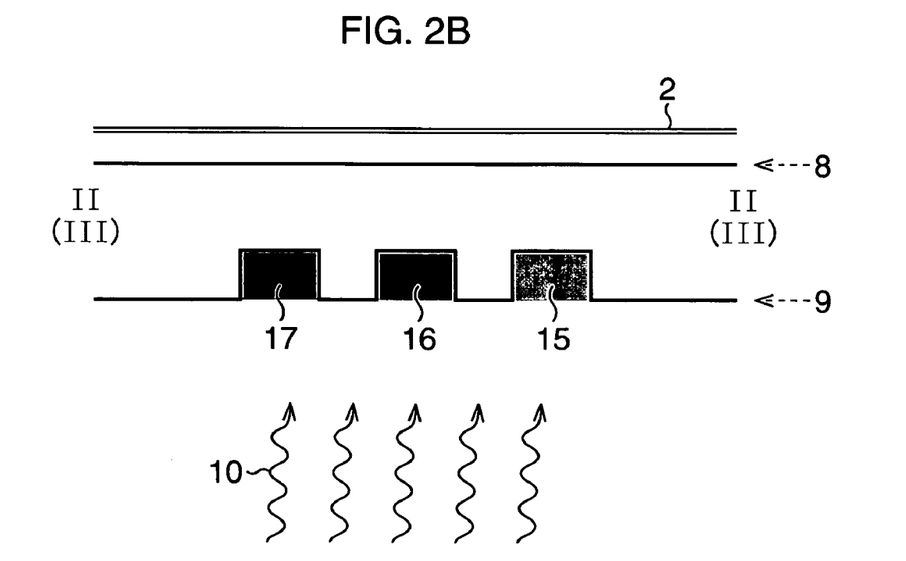

FIG. 2A and FIG. 2B are schematic block diagrams of a photo mask in the second embodiment of the present invention. FIG. 2A shows a plane view of the photo mask, and FIG. 2B shows a sectional view of evaluation patterns 18 and 19 in FIG. 2A taken along the lines II-II, and III-III.

In the second embodiment, though a basic structure is the same as that of the photo mask 1 in the first embodiment, a difference is that the evaluation patterns 18 and 19 are provided on a glass surface 9 side on which a mask pattern is not formed. In the present embodiment, it is possible to achieve the object of the present invention by forming only the evaluation pattern 18 provided in the scribe-corresponding region 13 in the effective region 5. However, in order to distinguish whether generation of a growable foreign substance occurs in the effective region 5 where ultraviolet rays 10 irradiates, or generation of the growable foreign substance occurs in the region where no irradiation is performed, the evaluation pattern 19 is formed in an outside region of the effective region 5.

A method for producing a photo mask according to the second embodiment will be explained next.

A mask pattern on which the light shielding pattern 6 and the light transmitting pattern 7 as shown in FIG. 7B are formed is formed on one surface of, for instance, a transparent quartz plate which will be the photo mask 1. A forming region on which the mask pattern is formed is the mask-pattern-forming region 4 in FIG. 2A.

Then, the evaluation patterns 18 and 19 are formed on the glass surface 9 side. The evaluation patterns 18 and 19 will be explained using FIG. 2B.

As shown in FIG. 2B, the evaluation patterns 18 and 19 are formed with the plural depressions 15 to 17 on the glass surface 9 side. The evaluation patterns 18 and 19 are formed by a dry etching method, a wet etching method with hydrofluoric acid, or the like. Liquids of a growable substance for evaluation having different residual ion concentrations are dropped into the respective depressions 15 to 17 using a hollow needle of a manipulator, an eye dropper, a glass tube, or the like, and dried. Here, as the liquid of growable substance for evaluation dropped into the respective depressions 15 to 17, a substance containing sulfuric acid ions, nitric acid ions, or ammonium ions which are thought to be the same kind as a foreign substance generated on the photo mask 1 can be cited. FIG. 2B shows a case in which the ion concentration of the growable substance for evaluation in the depression 15 is the lowest and the ion concentration of the growable substance for evaluation in the depression 17 is the highest.

Next, a method for controlling the photo mask in the second embodiment will be explained. The method for controlling the photo mask in the present embodiment is similar to the method for controlling the photo mask in the first embodiment, but will be explained below.

As a concrete method for controlling a photo mask using these evaluation patterns 18 and 19, for instance, a high-intensity light source irradiates to the evaluation pattern 18 to visually recognize appearances of the respective depressions 15 to 17, and whether cloudiness is observed or not is judged. As an example of the method for controlling a photo mask in an actual production process, it is possible to execute judgment in a manner that when cloudiness begins to be observed in the depression 17 having the highest ion concentration of a growable substance for evaluation (when generation of a growable substance for evaluation is recognized) it is judged that maintenance of the photo mask 1 is required, when cloudiness of the depression 16 begins to be observed, it is judged that rewashing with replacement of the pellicle film 2 on the photo mask 1 is required, and when cloudiness begins to be observed in the depression 15 having the lowest ion concentration of a growable substance for evaluation it is judged that a substance generated in the mask-pattern-forming region 4 might give a huge influence upon a mask pattern to be transferred to a wafer.

Third Embodiment

Figure 3A:
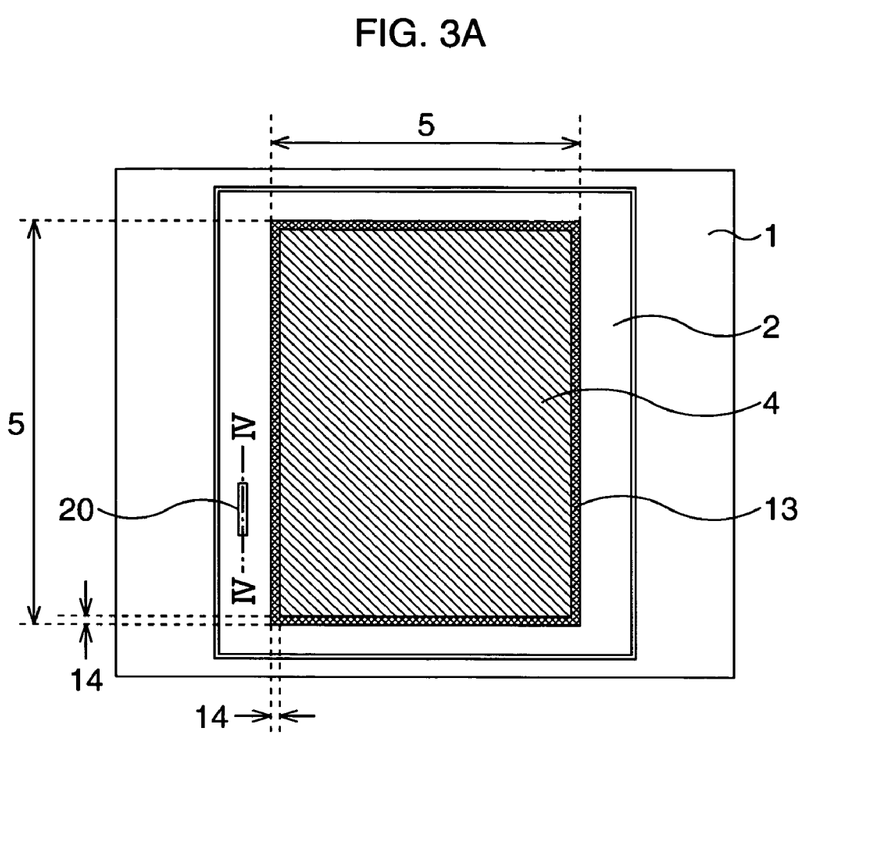
FIGS. 3A and 3B are schematic block diagrams of a photo mask in a third embodiment of the present invention.
Figure 3B:
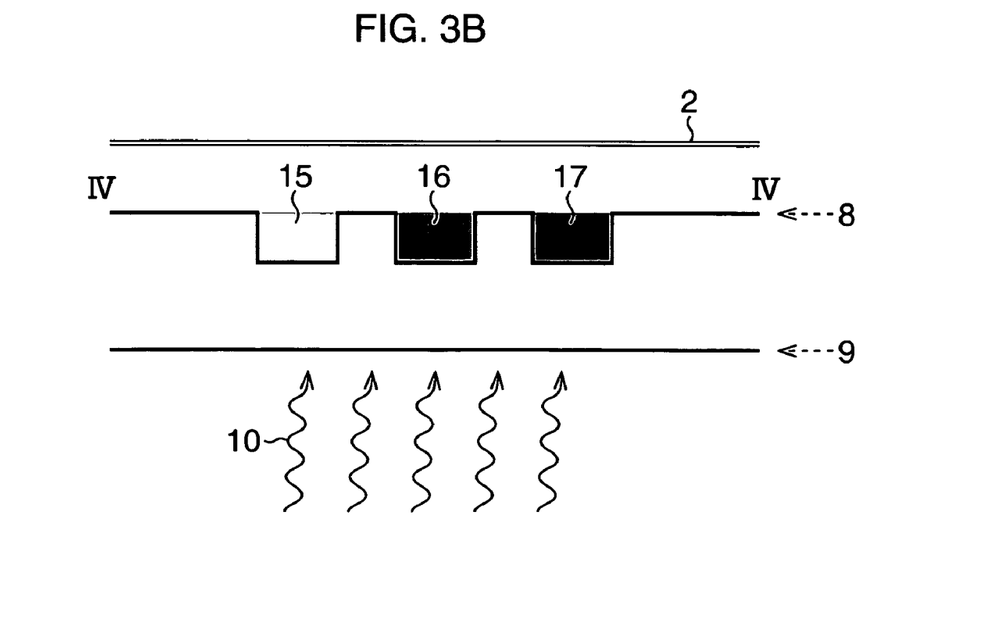

FIG. 3A and FIG. 3B are schematic block diagrams of a photo mask in the third embodiment of the present invention. FIG. 3A shows a plane view of the photo mask, and FIG. 3B shows a sectional view of an evaluation pattern 20 in FIG. 3A taken along the lines IV-IV.

In the third embodiment, though a basic structure is the same as that of the photo mask 1 in the first embodiment, a difference is that the evaluation pattern 20 is provided in an outside region of the effective region 5 on a mask-pattern-forming surface 8 side. This is effective in such a case when an evaluation pattern cannot be formed in the effective region 5, or when an accelerated irradiation test by ultraviolet rays is performed. It is also possible to form an evaluation pattern in an outside region of the effective region 5 of the glass surface 9 side from similar idea. However, in the case of the present embodiment, since ultraviolet rays are required to irradiate also in the outside region of the effective region 5, the evaluation pattern 20 is feared to be transferred to a wafer.

Figure 4A:
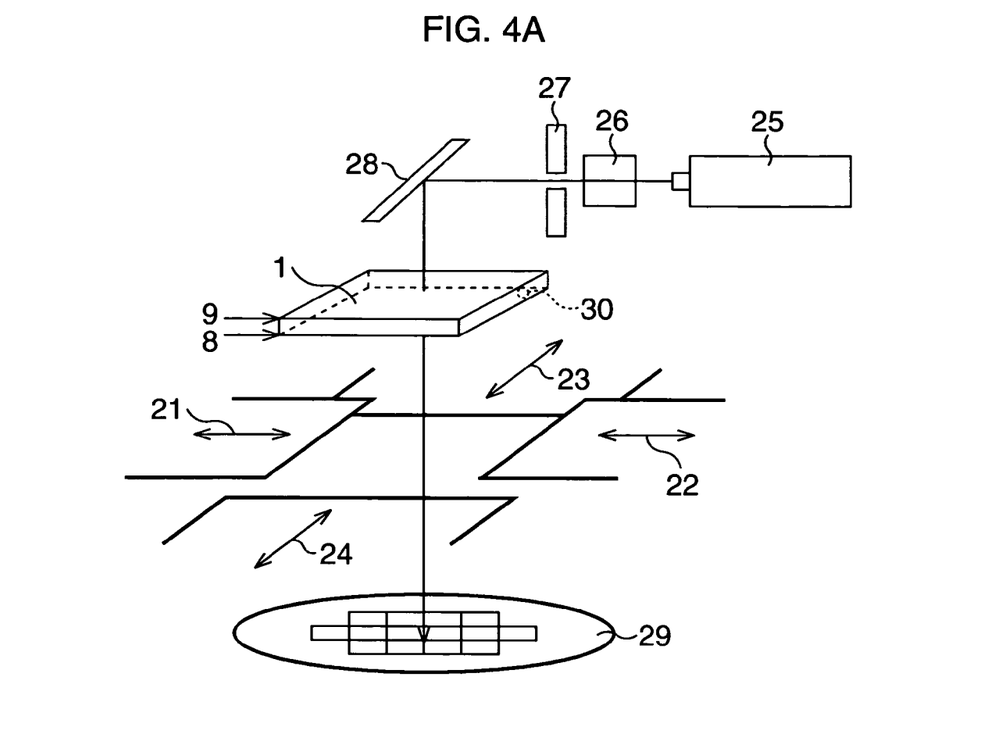
FIGS. 4A, 4B, and 4C are schematic block diagrams of a projection stepper.
Figure 4B:
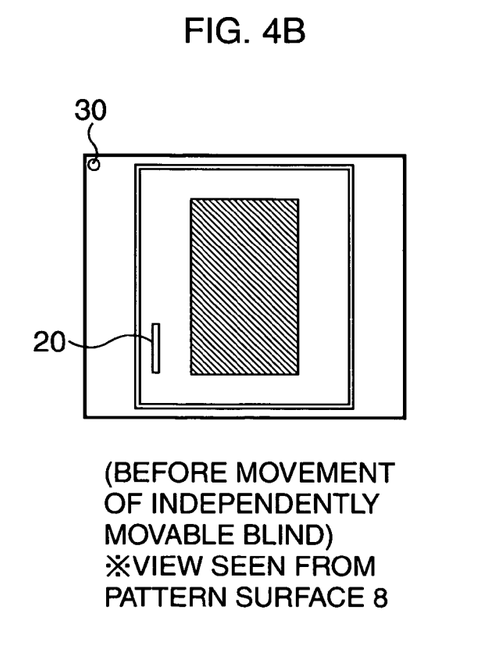
Figure 4C:
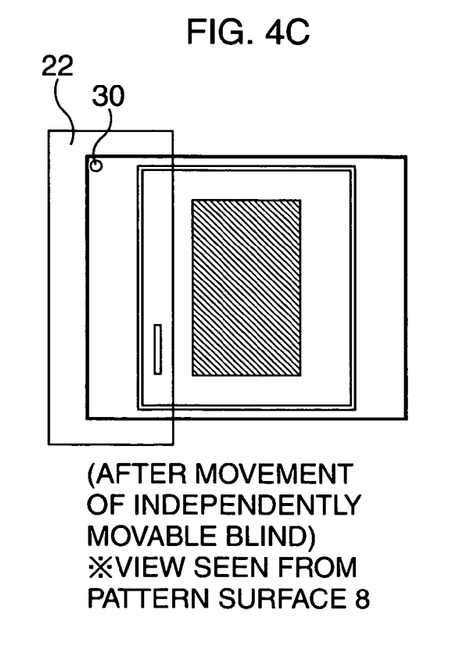

The countermeasure for the above will be shown in FIGS. 4A, 4B, and 4C.

FIGS. 4A, 4B, and 4C are schematic block diagrams of a projection stepper, and FIG. 4A is a block diagram of the entire projection stepper. FIGS. 4B, and 4C are plan views of the photo mask 1.

As shown in FIG. 4A, the projection stepper comprises a light source 25 for generating ultra violet rays, an aperture 26 to allow ultraviolet rays to pass through, a blind 27 adjusting an amount of transmission of ultraviolet rays, a mirror 28 to let the ultraviolet rays from the light source 25 enter into the photo mask 1, the photo mask 1 receiving ultraviolet rays from the mirror 28 to transfer a mask pattern to a wafer 29, and independently movable blinds 21 to 24 for shielding a predetermined region of the ultraviolet rays from the photo mask 1.

These independently movable blinds 21 to 24 are provided between the photo mask 1 and the wafer 29 to play a role in preventing the evaluation pattern 20 of the photo mask 1 from being transferred to the wafer 29. Since the independently movable blinds 21 to 24 may have an effect-on a normal transfer pattern when ultraviolet rays reflect on the blinds, it is advisable to apply ultraviolet absorber coating on the independently movable blinds 21 to 24. Besides, it is advisable to use an ultraviolet absorbing agent containing zinc oxide (ZnO) particles for the ultraviolet absorber coating. This is because it can make thickness of the coating thin and can perform the ultraviolet absorption effectively.

Here, the evaluation pattern 20 shown in FIG. 4B is assumed to exist in the photo mask 1 shown in FIG. 4A. The top-and-bottom relation in both drawings is shown by a position 30 in the drawings. In order to avoid transfer of the evaluation pattern 20 in FIG. 4B to the wafer 29, the independently movable blinds 22 in FIG. 4A is driven to shift to a position shown by FIG. 4C. When the evaluation pattern 20 exists at another positions on the photo mask 1, it can be handled similarly by driving the independently movable blinds 21, 23, and 24.

A method for producing the photo mask according to the third embodiment will be explained next.

First, a mask pattern on which the light shielding pattern 6 and the light transmitting pattern 7 are formed as shown in FIG. 7B is formed on one surface of, for instance, a transparent quartz plate which will be the photo mask 1. A forming region on which the mask pattern is formed is the mask-pattern-forming region 4 in FIG. 3A.

Then, the evaluation pattern 20 is formed outside the effective region 5 on the mask-pattern-forming surface 8 side. The evaluation patterns 20 will be explained using FIG. 3B.

As shown in FIG. 3B, the evaluation patterns 20 is formed outside the effective region 5 on the mask-pattern-forming surface 8 side with the plural depressions 15 to 17. The depressions 15 to 17 are formed by a dry etching method, a wet etching method with hydrofluoric acid, or the like. Liquids of a growable substance for evaluation having different residual ion concentrations are dropped into the respective depressions 15 to 17 using a hollow needle of a manipulator, an eye dropper, a glass tube, or the like, and dried. Here, as the liquid of growable substance for evaluation dropped into the respective depressions 15 to 17, a substance containing sulfuric acid ions, nitric acid ions, or ammonium ions which are thought to be the same kind as a foreign substance generated on the photo mask 1 can be cited. FIG. 3B shows a case in which the ion concentration of the growable substance for evaluation in the depression 15 is the lowest and the ion concentration of the growable substance for evaluation in the depression 17 is the highest.

After the liquid of the growable substance for evaluation dropped into the respective depressions 15 to 17 are dried completely, the pellicle film 2 is stuck on the photo mask 1. And in the present embodiment, an example that the mask pattern and the evaluation pattern 20 are separately formed is shown, but both may be simultaneously formed.

Next, a method for controlling the photo mask in the third embodiment will be explained. The method for controlling the photo mask in the present embodiment is similar to the method for controlling the photo mask in the first embodiment, but will be explained below.

As a concrete method for controlling a photo mask using this evaluation pattern 20, for instance, a high-intensity light source irradiates to the evaluation pattern 20 to visually recognize appearances of the respective depressions 15 to 17, and whether cloudiness is observed or not is judged. As an example of the method for controlling a photo mask in an actual production process, it is possible to execute judgment in a manner that when cloudiness begins to be observed in the depression 17 having the highest ion concentration of a growable substance for evaluation (when generation of a growable substance for evaluation is recognized) it is judged that maintenance of the photo mask 1 is required, when cloudiness of the depression 16 begins to be observed, it is judged that rewashing with replacement of the pellicle film 2 on the photo mask 1 is required, and when cloudiness begins to be observed in the depression 15 having the lowest ion concentration of a growable substance for evaluation it is judged that a substance generated in the mask-pattern-forming region 4 might give a huge influence upon a mask pattern to be transferred onto a wafer.

Fourth Embodiment

Figure 5A:
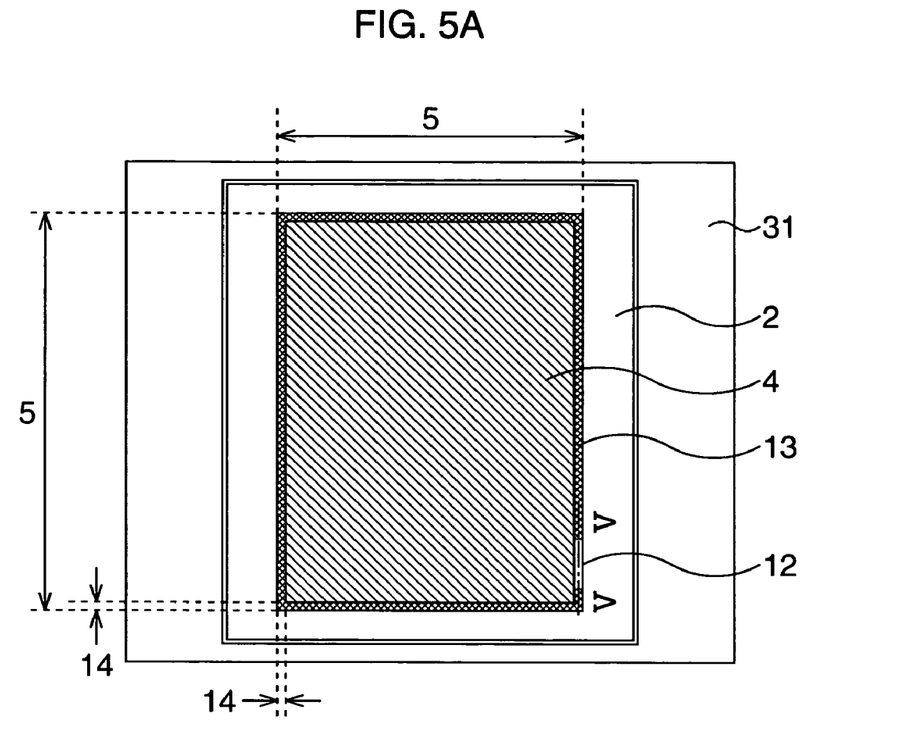
FIGS. 5A and 5B are schematic block diagrams of a photo mask in a fourth embodiment of the present invention.
Figure 5B:
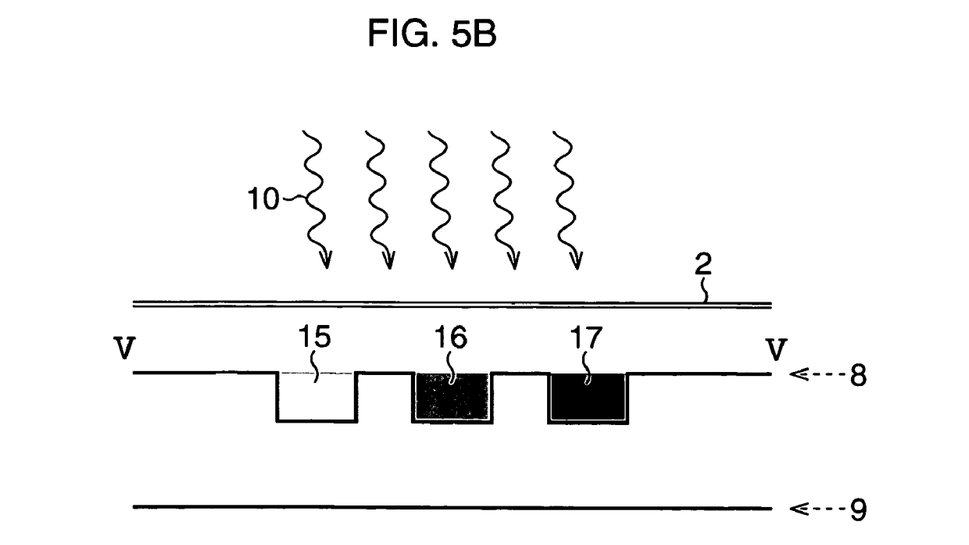

FIG. 5A and FIG. 5B are schematic block diagrams of a photo mask in the fourth embodiment of the present invention. FIG. 5A shows a plane view of the photo mask, and FIG. 5B shows a sectional view of an evaluation pattern 12 in FIG. 5A taken along the lines V-V.

The fourth embodiment is different from the first to third embodiments in a point in which a reflection type photo mask 31 is used in the fourth embodiment while the transmission type photo mask 1 is used in the first to third embodiments. FIGS. 5A and 5B show a reflection type photo mask 31 provided with the evaluation pattern 12 used in the first embodiment. It is also applicable to take a structure that the photo mask 31 is provided with the evaluation pattern of the photo mask 1 in the second or the third embodiment.

Figure 6A:
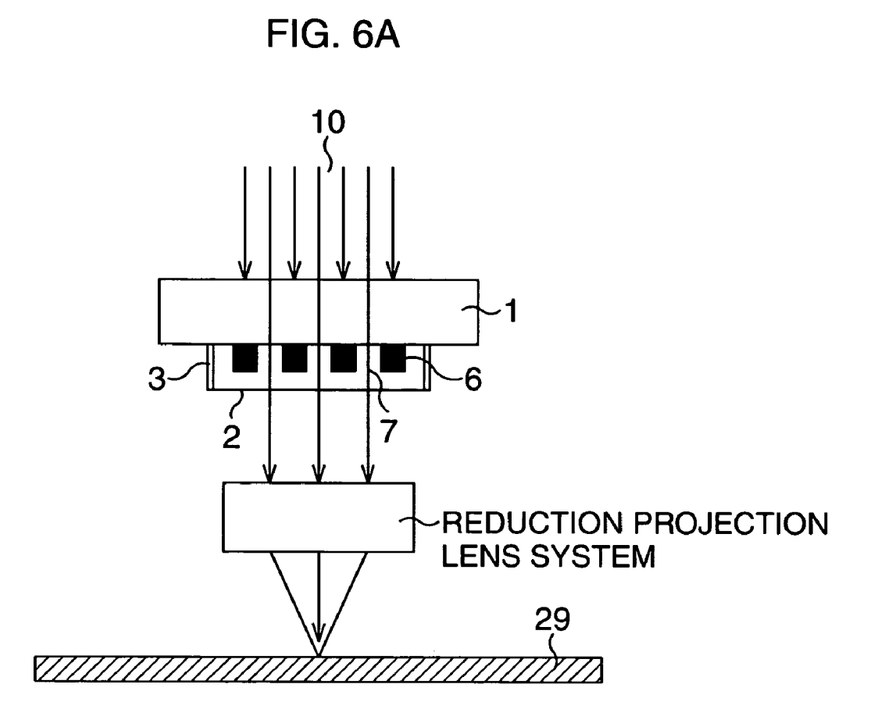
FIGS. 6A and 6B are views showing incident ultraviolet rays entering into the respective photo masks.
Figure 6B:
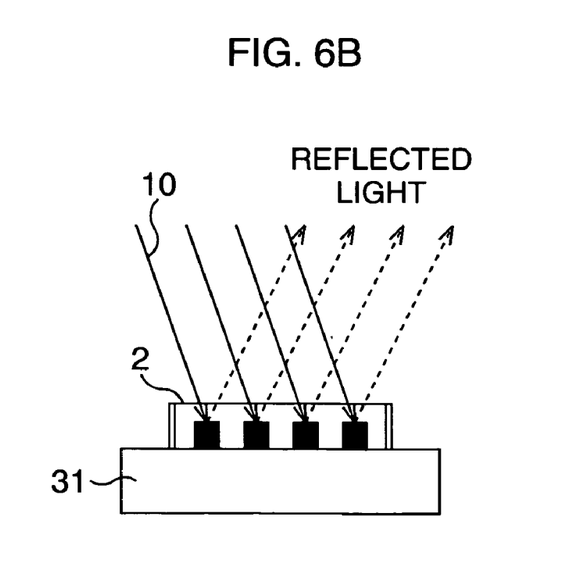

The reflection type photo mask 31 is largely different from the transmission type photo mask 1 in such that ultraviolet rays 10 are allowed to enter from a mask-pattern-forming surface 8 side of the photo mask by exposure. FIGS. 6A and 6B are views showing manners of the ultraviolet rays 10 entering into the respective photo masks. FIG. 6A shows a view of a manner of the ultraviolet rays 10 entering into the transmission type photo mask 1, and FIG. 6B shows a view of a manner of the ultraviolet rays 10 entering into the reflection type photo mask 31.

In the case of the present embodiment, since ultraviolet rays irradiate to the evaluation pattern 12, it is possible to execute judgment of usage limitation of the photo mask 31, similarly to the first embodiment. Further, since only the incident direction of the ultraviolet rays 10 is different from that of the second or third embodiment, it is possible to execute judgment of usage limitation of the reflection type photo mask 31 by applying the photo mask 31 to the second or third embodiment.

As the light source 25 for ultraviolet rays in the embodiments of the present invention, a KrF excimer laser (248 nm), an ArF excimer laser 193 nm), or an $F_2$ (fluorine gas) laser (157 nm) which is shorter in wavelength than g-rays (436 nm) or i-rays (365 nm) conventionally used is assumed, but the present invention is not limited to these, and any short-wavelength light source is applicable if it has a light source is shorter than a light energy to allow activated gas in a space closed by the pellicle film 2 to react to generate a foreign substance (for instance, 300 nm or less).

According to the respective embodiments from the first to the fourth of the present invention, since an evaluation pattern including a growable substance of the same kind as that of the foreign substance growing by ultraviolet rays in the mask-pattern-forming region 4 is provided on at least any one surface out of the mask-pattern-forming surface 8 and the glass surface 9 of the photo mask 1 (31), it becomes possible to evaluate a degree of growth of the foreign substance according to a degree of cloudiness in color of the respective depressions 15 to 17 by irradiating, for instance, a high intensity light source to the evaluation pattern 12. Thereby, it becomes possible to easily evaluate usage limitation of a photo mask used in the photolithographic process when performing a photolithographic processing by ultraviolet exposure.

The present invention makes it possible to easily evaluate usage limitation of the photo mask used in the photolithographic process when performing the photolithographic processing by ultraviolet exposure. Thus, enabling to easily control usage limitation of a photo mask exhibits a remarkable effect in a photolithographic process of, especially in a range of 200 nm or less in wavelength which will be a future leading stream in microprocessing.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A photo mask having a mask-pattern-forming region on which a mask pattern is formed on one surface to transfer the mask pattern to a substrate by ultraviolet exposure, said photo mask comprising:
   an evaluation section to evaluate usage limitation of the photo mask at ultraviolet exposure, said evaluation section being provided on at least any one surface out of the one surface and a back surface thereof;
   wherein said evaluation section is provided with a growable substance of the same kind as that of a foreign substance growing by ultraviolet rays in the mask-pattern-forming region.

2. The photo mask according to claim 1, wherein said evaluation section is provided in a region excepting the mask-pattern-forming region.

3. The photo mask according to claim 1, wherein said evaluation section is provided in a region corresponding to a scribed region of the substrate.

4. The photo mask according to claim 1, wherein said evaluation section is provided in plural regions.

5. The photo mask according to claim 1,
   wherein said evaluation section is provided with at least one depression; and
   wherein the depression is provided with the growable substance.

6. The photo mask according to claim 5,
   wherein said evaluation section is provided with plural depressions; and wherein the respective depressions are provided with the growable substance different in concentration from each other.

7. The photo mask according to claim 1, wherein the growable substance contains at least one kind of ion selected from a sulfuric acid ion, a nitric acid ion and an ammonium ion.

8. The photo mask according to claim 1, wherein a wavelength of ultraviolet rays at the ultraviolet exposure is 300 nm or less.

9. The photo mask according to claim 1, wherein the ultraviolet rays at the ultraviolet exposure irradiates from an excimer laser or an $F_2$ (fluorine gas) laser.

10. A method for controlling a photo mask having a mask-pattern-forming region on which a mask pattern is formed on one surface to transfer the mask pattern to a substrate by ultraviolet exposure, said method for controlling the photo mask comprising:

providing an evaluation section including a growable substance of the same kind as that of a foreign substance growing in the mask-pattern-forming region by ultraviolet rays, in a range of ultraviolet exposure at the time of the exposure on at least any one surface out of the one surface and the back surface thereof; and serving the evaluation section for judgment of usage limitation of the photo mask according to a degree of growth of the growable substance.

11. The method for controlling the photo mask according to claim 10, wherein the judgment of the usage limitation is in accordance with a degree of cloudiness in color of the growable substance in the evaluation section.

12. The method for controlling the photo mask according to claim 10, wherein said evaluation section is provided in a region excepting the mask-pattern-forming region.

13. The method for controlling the photo mask according to claim 10, wherein said evaluation section is provided in a region corresponding to a scribed region of the substrate.

14. The method for controlling the photo mask according to claim 10, wherein said evaluation section is provided in plural regions.

15. The method for controlling the photo mask according to claim 10, wherein said evaluation section is provided with at least one depression; and wherein the depression is provided with the growable substance.

16. The method for controlling the photo mask according to claim 15, wherein said evaluation section is provided with plural depressions; and wherein the respective depressions are provided with the growable substance different in concentration from each other.

17. The method for controlling the photo mask according to claim 10, wherein the growable substance contains at least one kind of ion selected from a sulfuric acid ion, a nitric acid ion and an ammonium ion.

18. The method for controlling the photo mask according to claim 10, wherein a wavelength of ultraviolet rays at the ultraviolet exposure is 300 nm or less.

19. The method for controlling the photo mask according to claim 10, wherein the ultraviolet rays at the ultraviolet exposure irradiates from an excimer laser or an $F_2$ (fluorine gas) laser.

* * * * *